United States Patent
Hurley

(10) Patent No.: US 6,204,206 B1
(45) Date of Patent: Mar. 20, 2001

(54) SILICON NITRIDE DEPOSITION METHOD

(75) Inventor: Kelly T. Hurley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 08/955,793

(22) Filed: Oct. 22, 1997

Related U.S. Application Data

(63) Continuation of application No. 08/655,728, filed on May 30, 1996.

(51) Int. Cl.[7] .................................................. H01L 21/31
(52) U.S. Cl. .......................... 438/791; 438/709; 438/762; 438/763
(58) Field of Search ..................... 438/396, 762, 438/763, 704, 791

(56) References Cited

U.S. PATENT DOCUMENTS

| | | | |
|---|---|---|---|
| 3,652,342 | 3/1972 | Chu et al. | 117/106 |
| 4,619,905 | * 10/1986 | Natansohn et al. | 501/97 |
| 4,645,683 | 2/1987 | Gourrier et al. | 427/38 |
| 4,855,258 | 8/1989 | Allman et al. | 437/241 |
| 4,901,133 | 2/1990 | Curran et al. | 357/54 |
| 5,010,024 | 4/1991 | Allen et al. | 437/24 |
| 5,633,202 | * 5/1997 | Brigham et al. | 438/763 |
| 5,670,431 | * 9/1997 | Huanga et al. | 438/762 |

FOREIGN PATENT DOCUMENTS 235535  9/1995 (JP) .

OTHER PUBLICATIONS

Seiichi Takami, et al., "Monolayer nitridation of silicon surfaces by a dry chemical process using dimethylhydrazine or ammonia", Appl. Phys. Lett., 66 (12), 1527–1529 (1995).

* cited by examiner

Primary Examiner—David Nelms
Assistant Examiner—Reneé R. Berry
(74) Attorney, Agent, or Firm—Mueting, Raasch & Gebhardt, P.A.

(57) ABSTRACT

A silicon nitride deposition method includes providing a substrate surface including one or more component surfaces. At least a monolayer of silicon is predeposited on the one or more component surfaces resulting in a substantially native oxide free uniform predeposited silicon substrate surface. A silicon nitride layer is then deposited on the predeposited silicon substrate surface after the silicon predeposition.

12 Claims, 5 Drawing Sheets

SILICON NITRIDE DEPOSITION METHOD

This is a continuation of application Ser. No. 08/655,728, filed May 30, 1996, (allowed) which is incorporated herein by reference.

FIELD OF THE INVENTION

The present invention relates to the fabrication of integrated circuit devices. In particular, the present invention pertains to methods for the deposition of silicon nitride in the fabrication of integrated circuits and devices resulting from such methods.

BACKGROUND OF THE INVENTION

Surface properties play an important role in the initial growth of films in thin-film processes. The increasing need for sophisticated film preparation processes, including epitaxial growth, selective growth, trench filling, etc., requires that the surface be uniform and well defined. Ideally, surface preparation techniques should be optimized for each particular film deposition process.

In particular, especially for deposited thin-films, the surface state before deposition directly impacts the interface properties between the surface and the thin film deposited. For example, different wafer surfaces, such as tetraethylorthosilicate (TEOS), borophosphosilicate glass (BPSG), or silicon, exhibit different nucleation and average deposition rates when silicon nitride is deposited thereon; however, once a uniform layer of nitride is convering the entire surface, the instantaneous deposition rate should be independent of the original surface. Further, for example, when silicon is exposed to air, native oxide is formed on the surface of silicon which may decrease the nitride deposition rate and inhibit the proper termination of silicon bonds at the silicon surface when a silicon nitride thin film surface is deposited thereon. The affected interface properties may degrade the isolation performance or dielectric quality of silicon nitride films deposited on the various surfaces.

Silicon nitride ($Si_3N_4$) deposition is important to the fabrication of integrated circuits because silicon nitride films act as diffusion barriers and have unique dielectric qualities. For example, high-quality dielectrics formed using silicon nitride films are used in the fabrication of MOSFET gates, memory cells, and precision capacitors. The interface between the substrate upon which the silicon nitride is deposited and the silicon nitride film, at least in part, defines the isolation and dielectric characteristics of the devices utilizing the silicon nitride film.

In a conventional silicon nitride deposition method 10 as represented in FIG. 1 upon a silicon surface (including single crystal, poly, epitaxial, etc.), the surface upon which the silicon nitride layer is to be deposited is normally pretreated such as by removing the native oxide using HF solutions and/or HCL solutions. A film of silicon nitride is then deposited on the pretreated surface such as by the reaction of silane with ammonia. Unless the pretreatment and silicon nitride deposition are performed in a cluster tool for controlling contamination, some native oxide may be present on the surface when the silicon nitride deposition is performed. The presence of native oxide degrades device performance and although the use of cluster tools reduces the native oxide growth, cluster tools reduce throughput of wafers and are generally more costly to operate as compared to standard processing equipment, such as conventional deposition reactors.

Moreover, as mentioned above, different nucleation and deposition rates occur for the deposition of silicon nitride on different wafer surfaces, such as TEOS, BPSG, or silicon. This leads to different or degraded electrical characteristics of the devices fabricated using a silicon nitride deposited layer on different wafer surfaces. In addition, when silicon nitride is deposited, an incubation time occurs at the start of the deposition process wherein there is no apparent deposition of silicon nitride on the wafer surface. Such differing nucleation and deposition rates and also the incubation period result in degraded electrical characteristics of the semiconductor devices being fabricated.

For the reasons indicated above and for other reasons which will become apparent from the detail below, improved methods of forming silicon nitride films are needed to improve the characteristics of the semiconductors devices fabricated, and also to reduce the cost and increase the throughput for fabricating such devices.

SUMMARY OF THE INVENTION

The method in accordance with the present invention is an improved method of forming silicon nitride films to improve the characteristics of semiconductor devices fabricated using silicon nitride films. Such methods may be performed at reduced cost and with increased throughput relative to other methods, such as with the use of cluster tools. In one embodiment, silicon nitride deposition is performed by providing a substrate surface including one or more different component surfaces. At least a monolayer of silicon is predeposited on the one or more component surfaces of the substrate surface resulting in a substantially native oxide free uniform predeposited silicon substrate surface. A silicon nitride layer is then deposited on the predeposited silicon substrate surface after the silicon predeposition.

DESCRIPTION OF THE PREFERRED EMBODIMENTS

Figure 1:
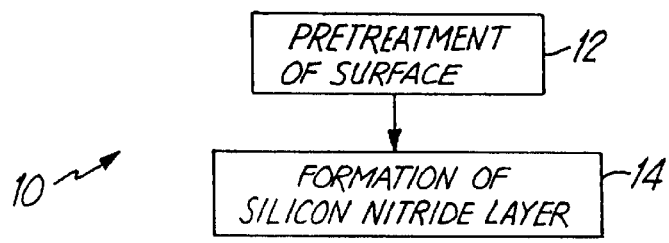
FIG. 1 is a general flow diagram of a conventional silicon nitride deposition method.
Figure 2:
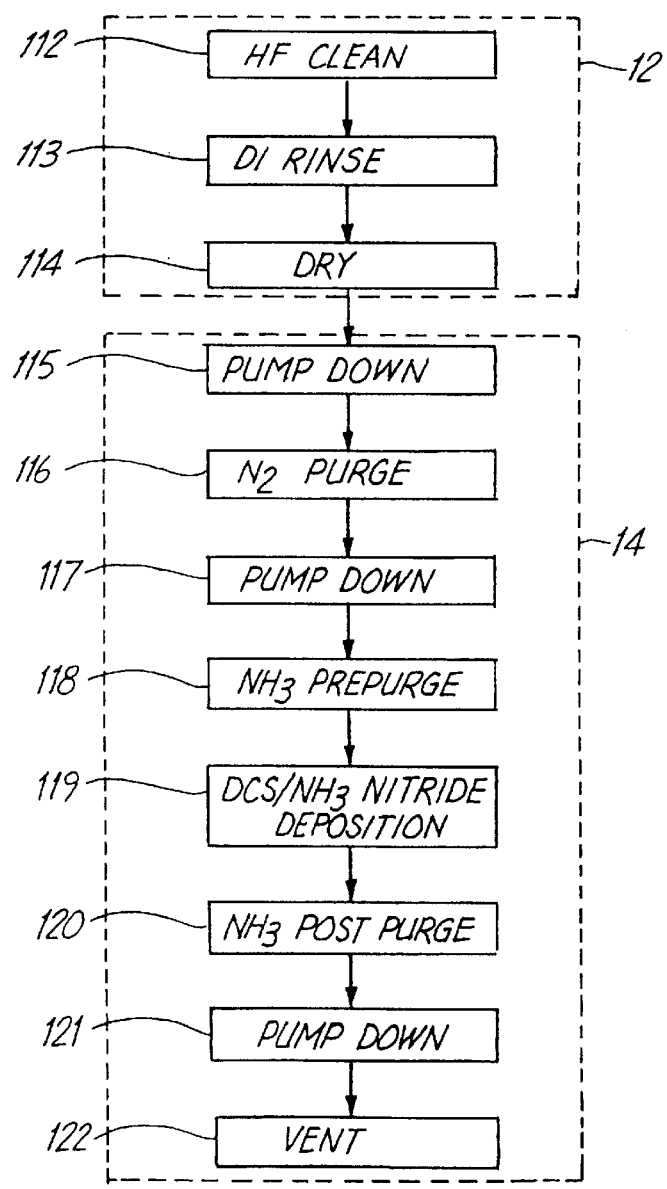
FIG. 2 is a more detailed flow diagram of the conventional silicon nitride deposition method of FIG. 1.

A conventional silicon nitride deposition process 10 for depositing a silicon nitride film is generally represented in the flow diagram of FIG. 1 and in further detail in the flow diagram of FIG. 2. The conventional method 10 generally includes a pretreatment or cleaning of the surface onto which the silicon nitride film or layer is to be deposited or grown (block 12) and includes the formation of the silicon nitride layer (block 14), such as by chemical vapor deposition (CVD).

The surface to be pretreated and onto which the silicon nitride layer is to be deposited may include different wafer surfaces of the semiconductor device being fabricated. For example, the wafer surface may include one or more of tetraethylorthosilicate (TEOS), borophosphosilicate glass (BPSG), silicon, polysilicon, other doped silicon or polysilicon surfaces, other doped oxides, thermal silicon dioxide, chemical vapor deposited (CVD) silicon dioxide, plasma enhanced CVD (PECVD) silicon dioxide, or any other film or surface upon which silicon nitride would be deposited in the fabrication of semiconductor devices.

The pretreatment (block 12) of the wafer surface in the conventional method may include any number of cleaning steps. Ultra clean water with very low ionic content may be utilized to perform one or more rinses during the cleaning process. Water having a very low ionic content has a resistivity of about 15 to 18 Mohms-cm.

A suitable pretreatment (block 12) may include a wet cleaning of the surface performed by immersing a wafer in an appropriate liquid solution, by spraying the wafer surface with the liquid solution, or by exposing the surface to a cleaning vapor. Such a wet cleaning may be accompanied with agitation or scrubbing such as by a brush or sonic power.

Wet cleaning may include cleaning the surface with an RCA clean as is known to one skilled in the art utilizing hydrogen peroxide ($H_2O_2$). However, typically, to remove native oxide from silicon wafer surfaces, an immersion in an HF solution or treatment by an HF vapor is used. The immersion or treatment may be for a period of time limited to, for example, 15 seconds. Further, such treatment or immersion may be repeated as necessary. Native oxide removal, for example, with respect to a silicon surface, is evidenced by the change of the surface from a hydrophilic oxidized surface to a hydrophobic bare silicon surface.

As shown by block 12 of FIG. 2, in a conventional pretreatment process, native oxide is removed by an HF clean, such as by immersion in an HF solution, or by HF vapor treatment, as represented by block 112. The HF cleaned surface is then rinsed in deionized water (block 113) and dried (block 114) as is known to one skilled in the art to result in a hydrophobic oxide free surface. Other cleaning processes may be utilized in addition to those described above and are clearly contemplated in accordance with the scope of the present invention as described in the accompanying claims. For example, some other pretreatment or cleaning processes may include the use of $NH_4F$ solution, $NH_4F$/HF solution or buffered oxide etch (BOE), or any other cleaning solution known to one skilled in the art that provides a hydrophobic oxide free surface.

Conventional methods are then typically used for forming a silicon nitride layer on the oxide free wafer surface as represented by block 14 in FIG. 1. Such conventional methods may include growing a silicon nitride film on silicon by reacting nitrogen or a nitrogen compound, such as ammonia ($NH_3$) with surface silicon atoms at elevated temperatures, typically 900° C. to 1300° C. As is known to one skilled in the art, a silicon nitride layer or film can also be formed or deposited on wafer surfaces utilizing CVD techniques. For example, a film of silicon nitride can be deposited by reacting silane with ammonia at about 700° C. to 900° C. and at atmospheric pressure. The deposition rate increases rapidly with temperature. While the rate of deposition at 700° C. may be less than 1 nm/min, it may increase to 100–200 nm/min at 900° C. The deposition rates will vary depending upon various conditions of the deposition as is well known to one skilled in the art.

Further, a conventional low pressure chemical vapor deposition (LPCVD) process may be used for depositing the silicon nitride film. The LPCVD silicon nitride process may include, for example, the reaction of dichlorosilane (DCS) and ammonia ($NH_3$) at a temperature of about 700° C. to 800° C. to deposit the silicon nitride film. Typical silicon to nitrogen ratios in such films range from 0.7 to 1.1 and the films deposited contain bonded hydrogen in the form of Si—H and N—H bonds. Moreover, additional conventional silicon nitride deposition processes are also suitable for deposition of silicon nitride. For example, such processes may include chemical physical deposition processes, plasma enhanced chemical vapor deposition processes, and rapid thermal chemical vapor deposition processes.

The preferred conventional method for deposition of the silicon nitride film is LPCVD of silicon nitride. The preferred conditions for LPCVD include a temperature in the range of about 650° C. to about 800° C., a pressure in the range of about 50 mTorr to about 700 mTorr, and with an $NH_3$:DCS ratio in the range of about 3:1 to about 10:1. However, although LPCVD and these conditions are preferred, other deposition methods and conditions also produce suitable silicon nitride films.

With respect to thin silicon nitride films, such as those deposited by a process using conventional hot wall LPCVD furnaces, different nucleation rates and average deposition rates have been shown to occur on different wafer surfaces. Surfaces exhibiting such different rates include but are not limited to one or more of tetraethylorthosilicate (TEOS), borophosphosilicate glass (BPSG), silicon, polysilicon, other doped silicon or polysilicon surfaces, other doped oxides, thermal silicon dioxide, chemical vapor deposited (CVD) silicon dioxide, and plasma enhanced CVD (PECVD) silicon dioxide. Further, deposition of silicon nitride on each of these surfaces also includes an incubation time at the start of the deposition where there is no apparent deposition of silicon nitride. This is particularly apparent where a cluster tool is not utilized, as described further below, and native oxide is grown on the silicon surfaces due to transfer through atmosphere from, for example, an HF vapor module to the LPCVD reactor. Such an incubation time may be as long as several minutes for some surfaces, although the incubation time is highly dependant on the deposition conditions which may vary. Thin silicon nitride films are typically 60 to 200 angstroms and more generally may include films of 500 angstroms or less. Moreover, such films may be less than 60 angstroms, such as 40 angstroms and less. Further, the present invention may provide benefit for thicker films, for example, 500 angstroms and above. However, the initial incubation time has less overall effect with respect to thicker films and thus the present invention may provide less overall benefit, i.e. the percentage of total deposition time taken up by the incubation time is less for thicker films.

Figure 8A:
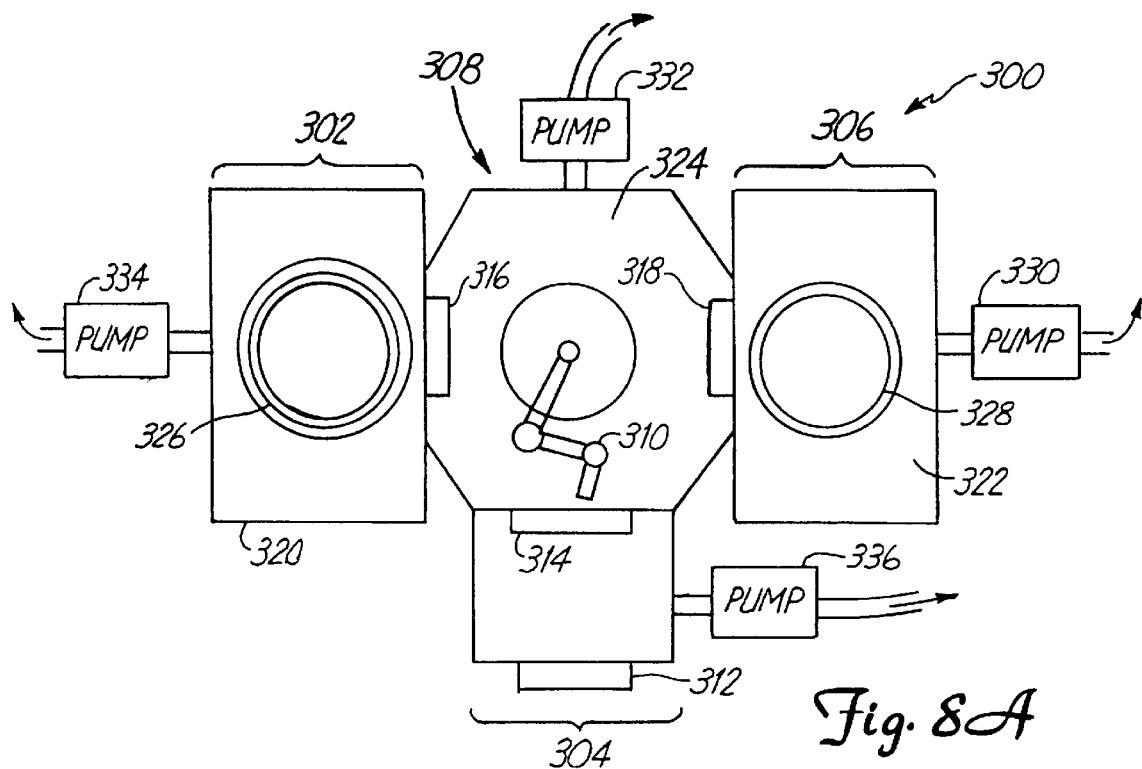
FIG. 8A is a general illustrative top view diagram of an LPCVD nitride cluster tool for use in performing the silicon nitride deposition process illustrated in FIG. 4 in accordance with the present invention.
Figure 8B:
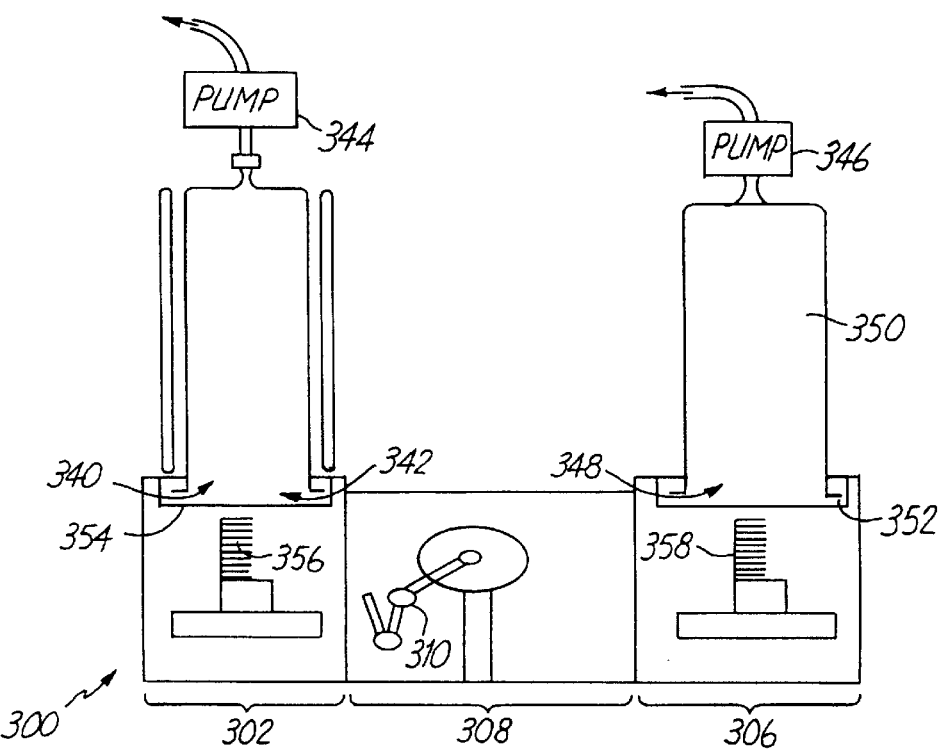
FIG. 8B is a general illustrative front view diagram of the LPCVD nitride cluster tool of FIG. 8A, excluding the input/output module, for use in performing the silicon nitride deposition process illustrated in FIG. 4 in accordance with the present invention.

In the conventional silicon nitride formation process 10 shown in FIG. 1, the process of pretreatment (block 12) of the wafer surfaces may be performed in situ with respect to the silicon nitride formation step (block 14). For example, a vacuum loadlock cluster tool, such as illustrated in FIG. 8A and 8B, may be utilized to perform the pretreatment (block 12), such as an HF vapor clean in an HF vapor module 306, and then the wafers are transferred to an LPCVD module 302 for silicon nitride deposition by a wafer transfer module 308 without exposure to air to prevent native oxide formation. In such a case, the incubation time for formation of the silicon nitride layer in the LPCVD module will likely be zero.

As shown by the detail flow diagram of FIG. 2, the conventional formation of the silicon nitride layer (block 14) can be performed, for example, by conventional LPCVD in the following manner as described with reference to FIG. 7, after the surface has been pretreated. The wafers 220 would be transferred to an LPCVD nitride deposition system 200 from a pretreatment unit (not shown). The wafers 220 would be positioned in the deposition chamber 204 of the system 200 via the door 214 and would be sealed in the chamber 204 as the sealing surfaces 212 come into contact. The heating elements 202 of the system are utilized to bring the temperature in the range of about 700° C. to 800° C.

Utilizing pump 206 of the system 200, the system is pumped down to a pressure of about 10 mTorr or less (block 115) after which an $N_2$ purge (block 116) is performed to clear out the deposition chamber 204. Although $N_2$ is preferred for the purge, any other inert gas is suitable for use. Following the $N_2$ purge, the system is pumped down again to a pressure of about 10 mTorr or less (block 117) after which an $NH_3$ prepurge (block 118) is performed during which the pressure is in the range of about 50 mTorr to about 700 mTorr. Plumbing to the chamber 204 for providing DCS, $NH_3$, and $N_2$ is generally designated by arrows 208 and 210 as is well known to those skilled in the art. For example, DCS and $N_2$ are provided by plumbing 208 and $NH_3$ and $N_2$ are provided by plumbing 210.

After the $NH_3$ prepurge (block 118), the DCS/$NH_3$ nitride deposition (block 119) is performed in accordance with the conventional LPCVD process and conditions described above. Following the silicon nitride layer being deposited (block 119), an $NH_3$ post purge (block 120) is performed during which the pressure is in the range of about 50 mTorr to about 700 mTorr and then the system is pumped down (block 121) to a pressure of about 10 mTorr or less. The deposition chamber is then vented (block 122) to atmosphere using $N_2$.

In accordance with the present invention as will be described with reference to FIGS. 2–8, a predeposition process is performed prior to depositing or growing the silicon nitride layer or film by the conventional LPCVD nitride deposition. As represented by the general flow diagram of FIG. 4, the silicon nitride deposition process 20 in accordance with the present invention includes pretreatment of a wafer or substrate surface as represented by block 22 and deposition of a silicon nitride layer utilizing the predeposition step or process (block 24).

Figure 3A:
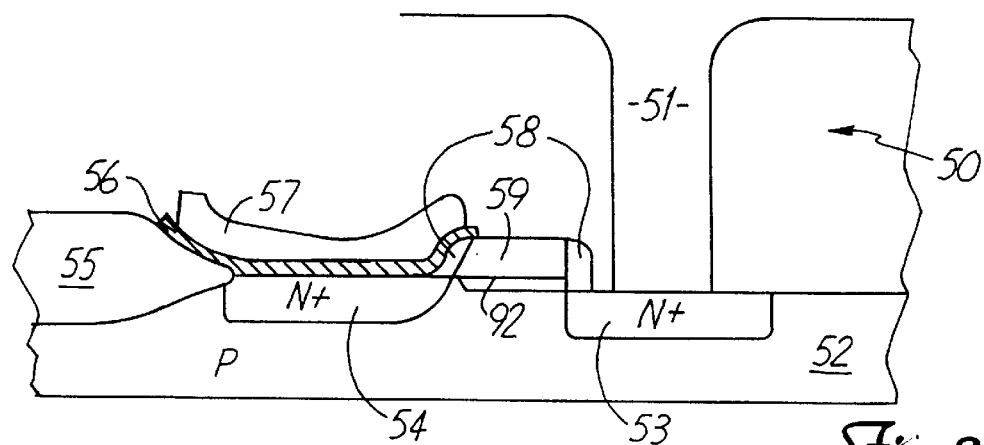
FIG. 3A–3C are illustrations of various embodiments of memory cells having a dielectric formed in accordance with the method of the present invention.
Figure 3B:
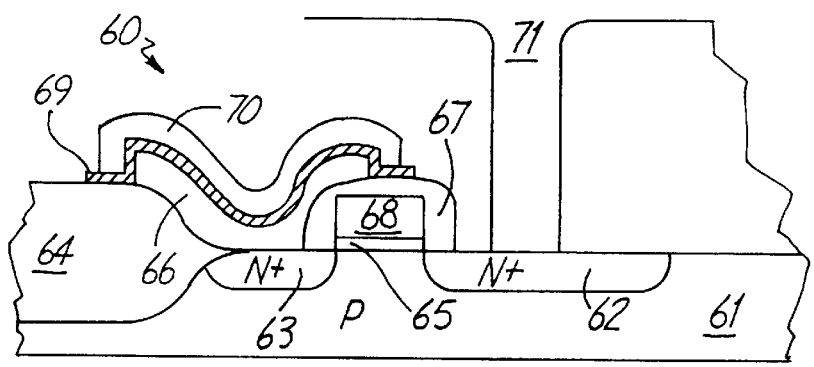
Figure 3C:
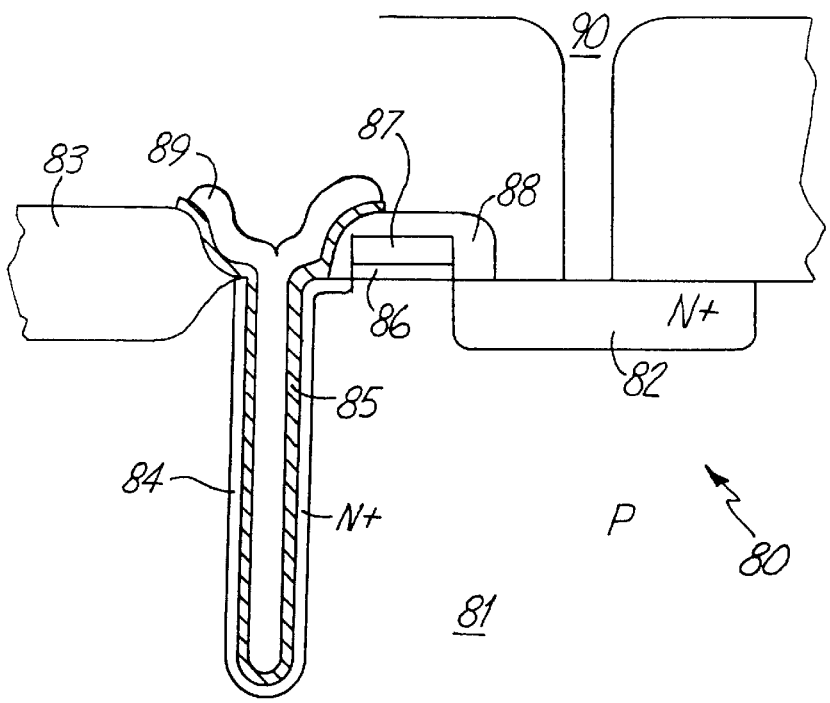

The wafer surface, or also referred to herein as the substrate surface, to be pretreated as represented by block 22 includes surfaces such as those surfaces of the various memory cells shown in FIGS. 3A–3C upon which a thin silicon nitride dielectric layer is deposited. The surface may include one or more of any one of the different types of surfaces as described above, including but not limited to wafer surfaces such as tetraethylorthosilicate (TEOS), borophosphosilicate glass (BPSG), silicon, polysilicon, other doped silicon or polysilicon surfaces, other doped oxides, thermal silicon dioxide, chemical vapor deposited (CVD) silicon dioxide, plasma enhanced CVD (PECVD) silicon dioxide, or any other film or surface upon which silicon nitride would be deposited in the fabrication of semiconductor devices. For example, the substrate surface may include a silicon surface portion, a TEOS surface portion, a field oxide portion or a polysilicon portion as shown in FIG. 3A–3C to be described further below. Because the substrate surface may include different types of surfaces, it is important that the nitride nucleation and deposition rates of silicon nitride be substantially equivalent for the different surfaces. Such uniform nucleation and deposition rates between the different wafer surfaces result in improved electrical characteristics for the semiconductor devices fabricated.

The pretreatment of the substrate surface (block 22) in accordance with the present invention is performed in a conventional manner as described above with reference to FIG. 1. For example, in addition to the HF immersion and the preferred HF vapor treatment as described previously, native oxide may be removed using a buffered HF solution, such as HF:$NH_4F$. The pretreatment may be performed in one or more treatment or immersion steps and further one or more rinsing steps in deionized water may be utilized. The pretreatment (block 22) terminates the silicon surface with a monolayer of hydrogen or, in other words, results in a hydrogen terminated surface. It will be readily apparent to one skilled in the art that many other pretreatment or cleaning processes may be used without departing from the present invention as described in the accompanying claims. For example, any pretreatment method, although preferably an HF vapor clean, may be used which results in a native oxide free surface.

Figure 4:
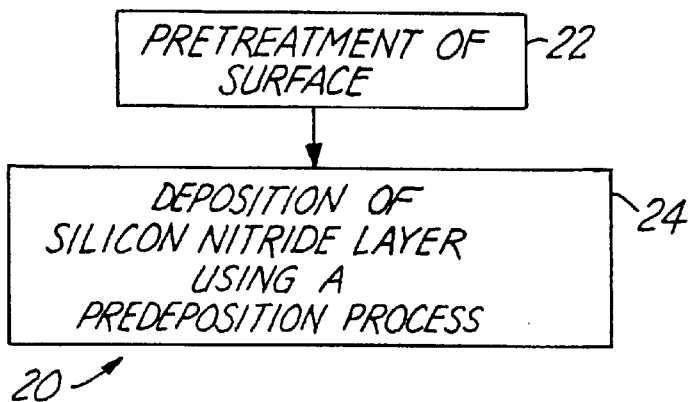
FIG. 4 is a general flow diagram of a silicon nitride deposition process in accordance with the present invention including pretreatment.
Figure 5:
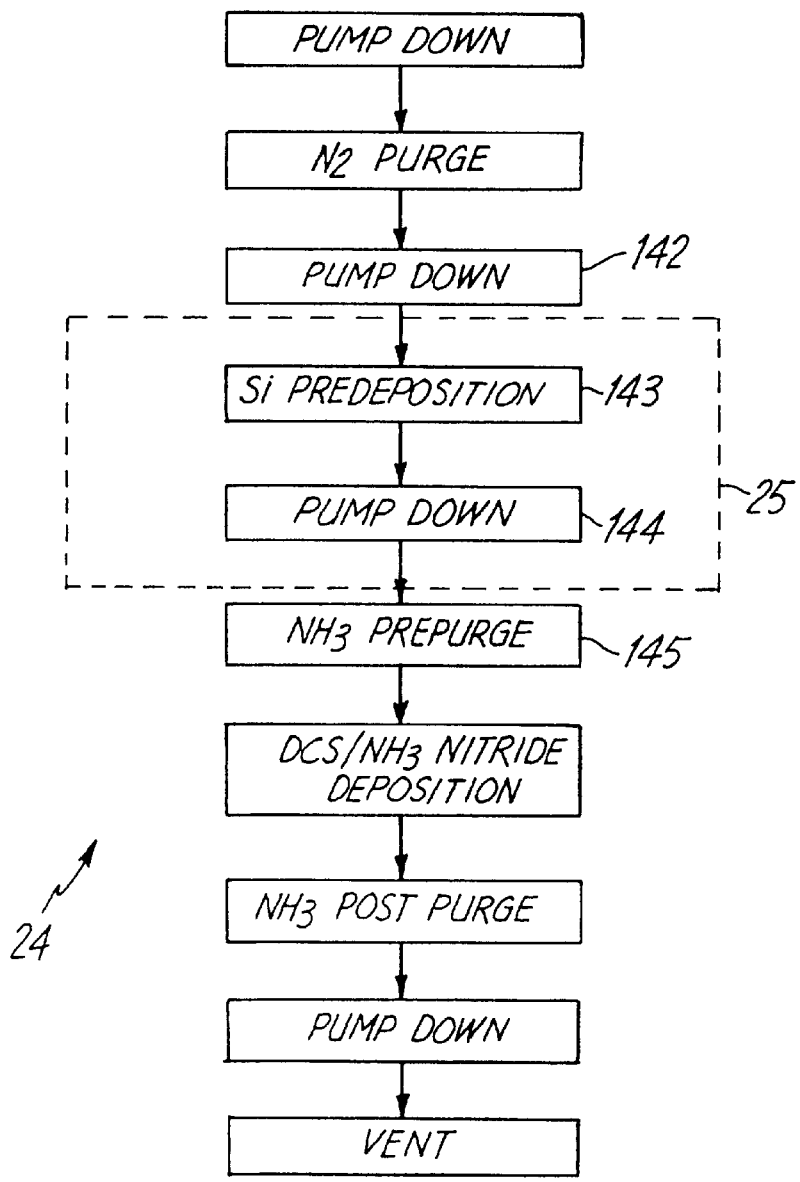
FIG. 5 is a more detailed flow diagram of one particular embodiment of the silicon nitride deposition step of the process illustrated in FIG. 4 using a silicon predeposition process.
Figure 6:
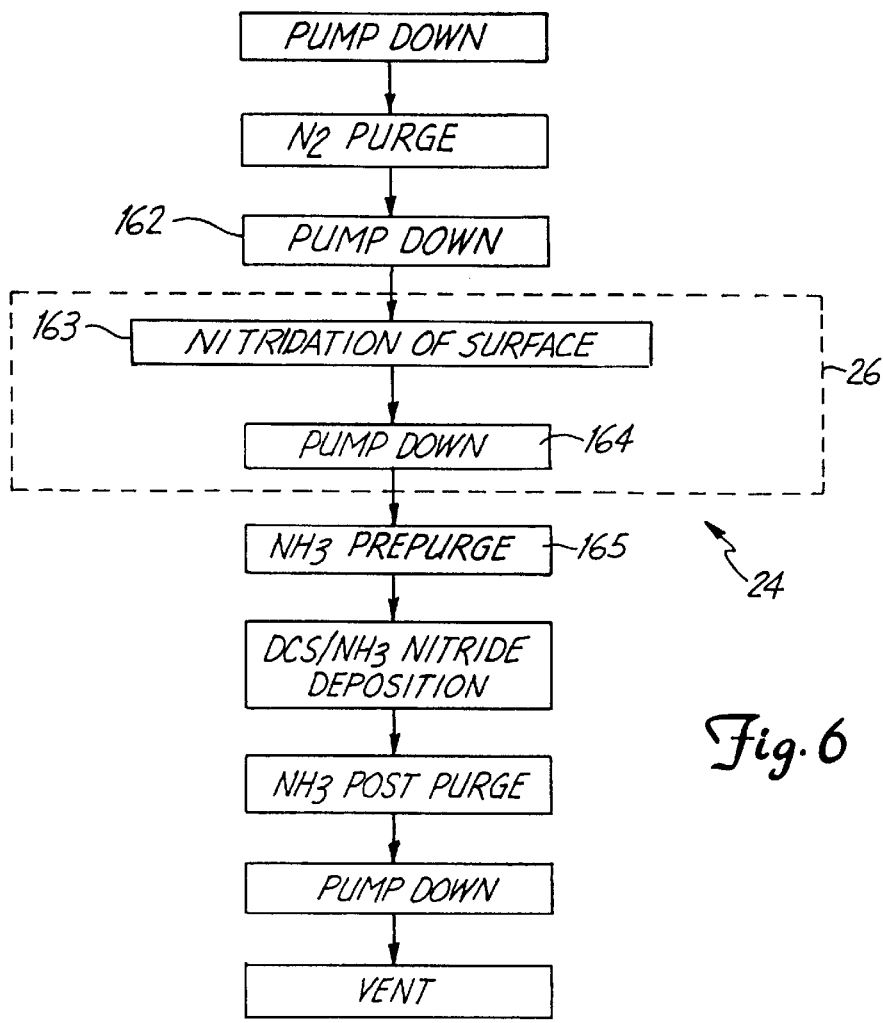
FIG. 6 is a more detailed flow diagram of another embodiment of the silicon nitride deposition step of the process illustrated in FIG. 4 using a nitridation process prior to conventional deposition of a silicon nitride layer.

The deposition of the silicon nitride layer using a predeposition process, as represented generally by block 24 in FIG. 4, may be performed in a number of different manners as is apparent from the different embodiments shown in FIGS. 5 and 6. In the embodiment of FIG. 5, the predeposition process (block 25) includes predepositing silicon prior to the conventional silicon nitride deposition step 146. In the embodiment of FIG. 6, the predeposition process (block 26) includes nitridating a silicon based surface, for example polysilicon, prior to the conventional silicon nitride deposition. With the use of the predeposition process, the nucleation rate, i.e. the number of nucleation sites, is increased at the interface between the substrate surface and the silicon nitride layer deposited thereon by conventional methods. Such an increase in nucleation at the interface provides for improved electrical characteristics, for example, dielectric characteristics.

As shown in the flow diagram of FIG. 5, the deposition of the silicon nitride layer using the predeposition process (block 24) in accordance with the present invention is performed in substantially the same manner as described with respect to FIG. 2 with the addition of the predeposition step 25. Therefore, the following description with reference to FIG. 5 shall be substantially limited to the predeposition step 25. The substrate surface, as described previously, may include one or more of tetraethylorthosilicate (TEOS), borophosphosilicate glass (BPSG), silicon, polysilicon, other doped silicon or polysilicon surfaces, other doped oxides, thermal silicon dioxide, chemical vapor deposited (CVD) silicon dioxide, plasma enhanced CVD (PECVD) silicon dioxide, or any other film or surface known to one skilled in the art upon which silicon nitride would be deposited in the fabrication of semiconductor devices.

As shown in FIG. 5, after the pump down 142 the predeposition step (block 25) includes predepositing silicon (block 143) and then pump down (block 144) to a pressure of about 10 mTorr or less. The predeposition process is then followed by the NH$_3$ prepurge (block 145) and the remainder of the steps as set forth in the description with reference to FIG. 2. The predeposited silicon film gives the wafer surface or surfaces a uniform silicon "appearance" at the start of the silicon nitride nucleation and deposition.

The predeposition of the silicon as represented by block 143 may be performed using silicon hydrides or silanes such as dichlorosilane (DCS, SiH$_2$Cl$_2$), silane (SiH$_4$), disilane (H$_3$SiSiH$_3$), trichlorosilane (TCS, SiHCl$_3$), or any other silicon precursor known to one skilled in the art. The thin silicon film predeposited (block 143) generally includes a monolayer or more in thickness. Preferably, the predeposition step (block 143) is performed using one of DCS, silane, or disilane, although DCS and silane are preferred over the others. Use of DCS may be beneficial as most LPCVD nitride deposition systems have DCS plumbed to the deposition chamber.

The predeposition using silane may be carried out at a temperature in the range of about 500° C. to about 800° C. and at a pressure in the range of about 50 mTorr to about 500 mTorr. On the other hand, the predeposition method using DCS to predeposit the silicon may be performed at a temperature in the range of about 900° C. to about 1000° C. and at a pressure in the range of about 50 mTorr to about 500 mtorr. Dichlorosilane is provided to the interior chamber 204 of an LPCVD system, such as by plumbing 208 of system 200 shown in FIG. 7; the interior chamber having located therein the wafers 220 including the surfaces upon which the silicon nitride layer is to be deposited.

The preferred method of predepositing the silicon includes the use of DCS because a standard LPCVD silicon nitride deposition system will typically already have DCS plumbed to the system. Further, the DCS to silicon deposition is a relatively slow reaction which can improve the process control needed to make the predeposited silicon at least a monolayer.

With respect to the process using the predeposition of silicon prior to the conventional silicon nitride deposition, several distinct advantages result therefrom. For example, with use of the predeposited silicon on the substrate surface or surfaces, a uniform silicon appearance is apparent at the time of the silicon nitride deposition. As such, the nitride nucleation and deposition rate of the silicon nitride upon the predeposited silicon is substantially the same and not dependant on whether the surface or surfaces are TEOS, silicon, BPSG, etc.

In addition, silicon nitride nucleation occurs faster with the use of the predeposited silicon than when no predeposition method is utilized. Such faster nucleation occurs because there is virtually no incubation time at the start of the silicon nitride deposition method. The thin silicon predeposited film is similar in nature to the silicon surface that would be formed when the silicon is precleaned insitu in a cluster tool as described further below. Therefore, when using a cluster tool, the advantage of faster silicon nitride nucleation may not be apparent because there is virtually no incubation period as no native oxide is allowed to form between HF preclean and silicon nitride deposition. However, the predeposition process used with a cluster tool still provides the benefit of uniform nucleation and substantially equivalent deposition rates of the silicon nitride on different wafer surfaces or films.

Further, the semiconductor devices fabricated with the silicon nitride deposition method according to the present invention has improved electrical characteristics due to uniform nucleation, substantially equivalent deposition rates between different wafer surfaces, and faster nucleation. Such electrical characteristics include, for example, higher breakdown voltage and greater oxidation resistance compared to silicon nitride deposited by conventional LPCVD techniques. In conventional silicon nitride deposition processes where a predeposition is not utilized, different or degraded electrical characteristics result from the differences in the nitride thickness deposited on adjacent surfaces. Such differences are especially apparent between a conductor (i.e. silicon) and an insulator (i.e. TEOS). Therefore, the relatively thin nitride deposited at, for example, a silicon/TEOS edge can result in degraded electrical properties at that edge and for the resulting devices fabricated therewith. The predeposition processes reduce such thickness differences and therefore alleviate such problems.

As shown in the flow diagram of FIG. 6, the deposition of the silicon nitride layer using the predeposition process (block 24) in accordance with the present invention is performed in substantially the same manner as described with respect to FIG. 2 with the addition of the nitridation step 26. Therefore, the following description with reference to FIG. 6 shall be substantially limited to the nitridation step 26. The substrate surface which is nitridated prior to conventional thin silicon nitride deposition is preferably a silicon, polysilicon, or other doped silicon or polysilicon surface.

As shown in FIG. 6, after the pump down 162, the predeposition process (block 26) is performed. The predeposition process (block 26) includes nitridation of the silicon based surface (block 163) and then pump down (block 164) to a pressure of about 10 mTorr or less. The predepostion process (block 26) is then followed by the NH$_3$ prepurge (block 165) and the remainder of the steps as set forth in the description with reference to FIG. 2.

The nitridation of the silicon based surface (block 163) is performed in a dimethylhydrazine (DMH) (H$_2$N-N(CH$_3$)$_2$) or ammonia (NH$_3$) atmosphere at a temperature in the range of about 400° C. to about 600° C. and at a pressure in the range of about 1 mTorr to about 10 mTorr. For example, nitride deposition is initiated by introducing a stream of DMH or NH$_3$ into an LPCVD system, such as by plumbing 208 into the deposition chamber 204 of the system 200 as shown in FIG. 7 which has the wafers therein for exposure of the hydrogenated wafer surfaces to the stream. The result of the nitridation is that nitrogen atoms are bound uniformly with three silicon atoms. Below 500° C., the surface coverage should be a monolayer of silicon nitride, independent of temperature, although the time required to achieve the monolayer increases as temperature decreases. On the contrary, at 550 to 600° C., the surface exceeds a monolayer and at 600° C., the surface coverage may approach a double layer of silicon nitride. Suitable nitridation of the silicon based surfaces results in less than three monolayers of silicon nitride formation and preferably less than a double layer of silicon nitride. Beneficial nitridation prior to the conventional silicon nitride deposition may even be less than a monolayer. The time period necessary for nitridating the surface is dependent on the other conditions used for the deposition and the desired thickness.

Because DMH is a derivative of hydrazine (H$_2$NNH$_2$), which is very reactive, DMH causes nitridation of the hydrogen terminated silicon surface without the need for the desorption of hydrogen. Therefore, the nitridation rates using DMH are higher than those using NH$_3$. Also because of the high reactivity, surface contamination during nitridation with DMH is reduced because, for example, bare silicon surfaces, which are susceptible to contamination, are not required for nitridation.

Further, because DMH contains carbon atoms, there is a possibility of incorporating carbon into the silicon surfaces above certain temperatures. Therefore, it is preferable to nitridate the surface at a temperature in the range of about 400° C. to about 500° C. to avoid carbon incorporation in the silicon surface.

The passivation of a surface with, for example, a monolayer of N atoms improves the interface characteristics between the surface and the silicon nitride layer deposited thereon. This is of particular importance in cell dielectrics for memory cells, such as the memory cells shown in FIGS. 3A–3C. The electrical characteristics of the interface and the cell dielectrics are dependant upon the nucleation rate, i.e. the number of nucleation sites, which are increased with the predepostion process to provide an improved interface.

After the predeposition of silicon (block 25) or the nitridation of the surface (block 26) are performed and pump down is performed, a conventional silicon nitride process as describe above with reference to FIG. 1 is performed to complete the silicon nitride deposition process 20 as shown in FIG. 4. The silicon nitride process 20 can be carried out using any of the methods previously described and using different types of reactors, such as LPCVD reactors, CVD reactors, single wafer reactors, etc.

Figure 7:
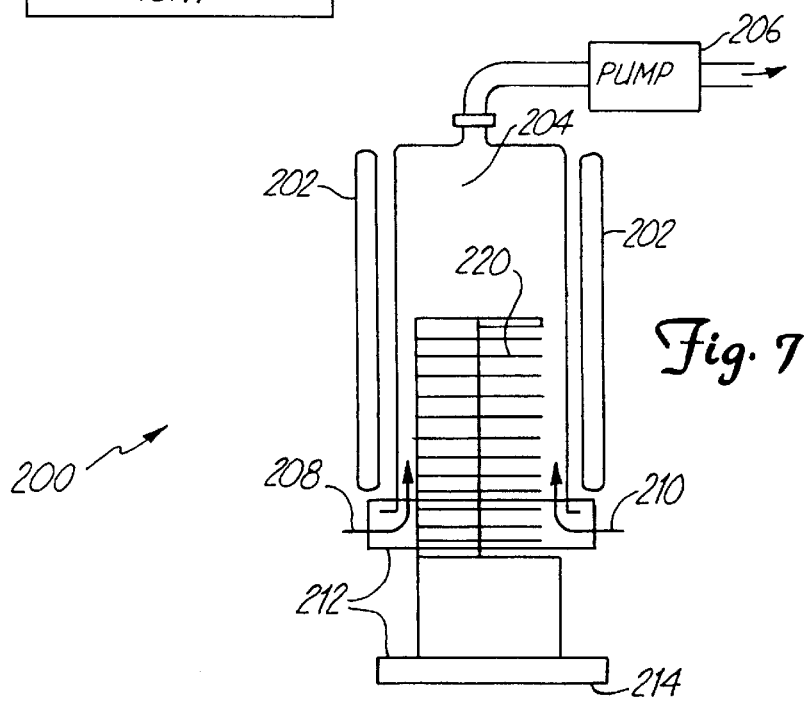
FIG. 7 is an illustrative diagram of an LPCVD nitride system for use in the silicon nitride deposition step of the process illustrated in FIG. 4 in accordance with the present invention.

Preferably, the predepositions (blocks 25 and 26) and conventional silicon nitride deposition as shown in FIGS. 1, 5, and 6 are carried out using a LPCVD nitride system as shown in FIG. 7 or a cluster tool 300 as generally illustrated in FIGS. 8A and 8B. The predepositions and conventional silicon nitride depositions have been previously described with reference to FIGS. 1, 5, and 6 using the LPCVD nitride system 200 of FIG. 7. The following, therefore, is only a general description of the process 20 of FIG. 4 utilizing the cluster tool 300 with reference to FIG. 8A and 8B.

The cluster tool illustrated in FIG. 8A and 8B, includes an LPCVD module 302, an HF etch module 306, a wafer transfer module 308, and an input/output module 304. The generalized top view of FIG. 8A shows the general relative position of the modules relative to one another with the wafer transfer tool 310, such as a robotic tool, being capable of transferring the wafers between the various modules without exposure to atmosphere and thus without the growth of native oxide between processes such as HF vapor clean and nitride deposition. The wafers 356 are input and output through door 312 of input/output module 304 which is the only module that is taken between atmosphere and vacuum by pump 336 during the process. The wafers 356 are transferred between the various modules under vacuum by the wafer transfer tool 310 via doors 314, 316, and 318. The portions of the modules under vacuum are shown more clearly in FIG. 8B which is generally a view from the front of the system with the input/output module removed. Such portions under vacuum include the lower portion of the LPCVD module 302, the lower portion of the HF etch module 306, and the wafer transfer module 308; the vacuum conditions being provided by pumps 330, 332, and 334. The proper conditions for the various processes in the module are provided, at least in part, by the pumps 344 and 346 and the heating elements associated with the various chambers (not all shown). Such cluster tools are generally known to one skilled in the art and any cluster tool configuration for providing transfer from module to module without exposure to atmosphere is suitable for use in performing the method of the present invention.

Generally, when using the cluster tool, the wafers are input via the input/output module 304 which is then evacuated. The wafer transfer tool then moves the wafers to the HF etch module 306 for performing an HF vapor clean in chamber 350 as described previously with reference to FIG. 1 to remove native oxide from the substrate surface. The wafer transfer tool 310 then transfers the pretreated wafers under vacuum and without the possibility of native oxide growth to the LPCVD module 302 for predeposition in accordance with the present invention as described previously with reference to FIGS. 5 and 6, and also conventional silicon nitride deposition as described previously also with reference to FIGS. 5 and 6 and, in addition, with reference to FIG. 1.

Use of the cluster tool is contrasted with the process 20 that is not performed insitu. For example, the silicon nitride process 20 of FIG. 4 may be carried out by performing the pretreatment or cleaning process, such as an HF preclean, in a HF vapor chamber. The pretreated wafers would then be transferred to an LPCVD deposition reactor or module with exposure to the atmosphere. In other words, the preclean process is not an in situ process and native oxide growth on the silicon surfaces of the wafer is possible. The LPCVD reactor or module is then utilized to perform the predeposition and conventional nitride deposition process.

With respect to the process using the silicon predeposition, several distinct advantages result therefrom. For example, with use of the thin silicon film on the substrate surface or surfaces, a uniform silicon appearance is apparent at the time of the silicon nitride deposition. As such, the nitride nucleation and deposition rate of the silicon nitride upon the predeposited silicon is substantially the same and not dependant on whether the surface or surfaces are TEOS, silicon, BPSG, etc.

In addition, silicon nitride nucleation occurs faster with the use of the predeposited silicon than when no predeposition method is utilized. Such faster nucleation occurs because there is virtually no incubation time at the start of the silicon nitride deposition method. The thin silicon predeposited film is similar in nature to the silicon surface that would be formed when the silicon is precleaned insitu in a cluster tool. Therefore, when using a cluster tool, the advantage of faster silicon nitride nucleation may not be apparent because there is virtually no incubation period as no native oxide is allowed to form between HF preclean and silicon nitride deposition. However, the predeposition process used with a cluster tool still provides the benefit of uniform nucleation and substantially equivalent deposition rates of the silicon nitride on different wafer surfaces or films.

Further, the semiconductor devices fabricated with the silicon nitride deposition method according to the present invention has improved electrical characteristics due to uniform nucleation, substantially equivalent deposition rates between different wafer surfaces, and faster nucleation. Such electrical characteristics include, for example, higher breakdown voltage and greater oxidation resistance compared to silicon nitride deposited by conventional LPCVD techniques.

Moreover, with use of the predeposited silicon and then the deposition of the silicon nitride layer while the wafer is still under vacuum in a conventional LPCVD furnace, no native oxide growth occurs and the benefits of a cluster tool are achieved without the use of a cluster tool. Therefore, the associated cost and lower throughput associated with the use of a cluster tool is avoided.

The present invention is beneficial for all thin dielectric applications using silicon nitride. For example, such applications include the dielectrics for memory cells as shown in FIGS. 3A–3C. Further, the present invention would also provide improved interface characteristics for other thin dielectric applications such as, for example, a gate dielectric. The memory cells illustrated in FIGS. 3A–3C include a planar cell 50, a stack cell 60, and a trench cell 80, respectively.

The planar memory cell 50 of FIG. 3A, includes the silicon nitride dielectric film 56 deposited on the n+-type silicon 54 which serves as the bottom plate of the capacitor. As shown, the silicon nitride film 56 is not only deposited on the n+-type silicon but also is deposited on the field oxide 55, and TEOS spacer 58. This illustrates the need for substantially uniform nucleation and deposition rates over varying types of surfaces as previously described. The polysilicon region 57 forms the top plate of the capacitor of the cell. The n+-type silicon 54 and n+-type silicon regions 53 are formed in the p-type silicon substrate 52. The other regions, not previously mentioned, used in forming the transistor of the cell include polysilicon region 59, gate oxide 92, and metalization 51.

The stack memory cell 60 of FIG. 3B, includes the silicon nitride dielectric film 69 deposited on the polysilicon layer 66 which serves as the bottom plate of the capacitor of the memory cell. As shown, the silicon nitride film 69 is not only deposited on the polysilicon layer 66 but also is deposited on the field oxide 64, and TEOS layer 67. This, once again, illustrates the need for substantially uniform nucleation and deposition rates over varying types of surfaces as previously described. The polysilicon region or layer 70 forms the top plate of the capacitor of the cell. The n+-type silicon region 63 and n+-type silicon region 62 are formed in the p-type silicon substrate 61. The other regions, not previously mentioned, used in forming the transistor of of the cell include polysilicon region 68, gate oxide 65, and metalization 71.

The trench memory cell 80 of FIG. 3C, includes the silicon nitride dielectric film 85 deposited on the n+-type silicon 84 which serves as the bottom plate of the capacitor. As shown, the silicon nitride film 85 is not only deposited on the n+-type silicon but also is deposited on the field oxide 83, and TEOS film or region 88. This further illustrates the need for substantially uniform nucleation and deposition rates over varying types of surfaces as previously described. The polysilicon region 89 forms the top plate of the capacitor of the cell. The n+-type silicon region 84 and n+-type silicon region 82 are formed in the p-type silicon substrate 81. The other regions, not previously mentioned, used in forming the transistor of the cell include polysilicon region 87, gate oxide 86, and metalization 90.

As indicated above, the method in accordance with the present invention is not only suitable for the memory cells illustrated above, but can be utilized for any dielectric applications utilizing silicon nitride films. As such, the above memory cell configurations are purely for illustration only and are not to be taken as limiting to the present invention as defined by the accompanying claims.

Although the invention has been described with particular reference to preferred embodiments thereof, variations and modifications of the present invention can be made within a contemplated scope of the following claims as is readily known to one skilled in the art.

What is claimed is:

1. A silicon nitride deposition method comprising the steps of:
   providing a substrate surface including one or more component surfaces;
   predepositing at least a monolayer of silicon on the one or more component surfaces of the substrate surface resulting in a substantially native oxide free uniform predeposited silicon substrate surface; and
   depositing a silicon nitride layer on the predeposited silicon substrate surface after the silicon predeposition.

2. The method according to claim 1, wherein silicon nitride nucleation at the substrate surface having silicon predeposited thereon is performed at a substantially equivalent rate on the one or more component surfaces.

3. The method according to claim 1, wherein an incubation time for the start of silicon nitride nucleation being decreased relative to the incubation time for the start of silicon nitride nucleation when silicon nitride is deposited without predeposition of silicon on the substrate surface.

4. The method according to claim 1, wherein the predeposition step includes the step of predepositing the silicon using one of silane, disilane, silicon tetrachloride, dichlorosilane, trichlorosilane.

5. The method according to claim 2, wherein the component surfaces include one or more of tetraethylorthosilicate, borophosphosilicate glass, silicon, polysilicon, other doped silicon or polysilicon surfaces, other doped oxides, thermal silicon dioxide, chemical vapor deposited silicon dioxide, and plasma enhanced chemical vapor deposited silicon dioxide.

6. The method according to claim 1, wherein the substrate surface is moved through air after native oxide removal to a deposition chamber, the silicon is predeposited in the deposition chamber after which the silicon nitride layer is deposited in the same deposition chamber.

7. The method according to claim 1, further including the step of removing native oxide from the substrate surface in a cluster tool, and wherein the silicon is predeposited after which the silicon nitride layer is deposited in the same cluster tool.

8. The method according to claim 1, wherein the predeposition step includes predepositing the at least a monolayer of silicon on portions of two or more component surfaces of the substrate surface resulting in the predeposited silicon substrate surface.

9. The method according to claim 8, wherein silicon nitride nucleation at the substrate surface having silicon predeposited thereon is performed at a substantially equivalent rate on the two or more component surfaces.

10. The method according to claim 8, wherein the predeposition step includes the step of predepositing the silicon using one of silane, disilane, silicon tetrachloride, dichlorosilane, trichlorosilane.

11. The method according to claim 10, wherein the predeposition step includes the step of predepositing the silicon using dichlorosilane.

12. The method according to claim 8, wherein the component surfaces include two or more of tetraethylorthosilicate, borophosphosilicate glass, silicon, polysilicon, other doped silicon or polysilicon surfaces, other doped oxides, thermal silicon dioxide, chemical vapor deposited silicon dioxide, and plasma enhanced chemical vapor deposited silicon dioxide.

* * * * *